(12) United States Patent  
Liao et al.

(10) Patent No.: US 9,112,077 B1  
(45) Date of Patent: Aug. 18, 2015

(54) SEMICONDUCTOR STRUCTURE

(71) Applicant: Industrial Technology Research Institute, Hsinchu (TW)

(72) Inventors: Chen-Zi Liao, Nantou County (TW); Chih-Wei Hu, Taoyuan County (TW); Hsun-Chih Liu, Taipei (TW); Yen-Hsiang Fang, New Taipei (TW); Rong Xuan, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/263,978

(22) Filed: Apr. 28, 2014

(51) Int. Cl.  
    *H01L 23/52* (2006.01)  
    *H01L 29/06* (2006.01)  
    *H01L 33/00* (2010.01)  
    *H01L 21/00* (2006.01)  
    *H01L 33/04* (2010.01)

(52) U.S. Cl.  
    CPC ............. *H01L 33/04* (2013.01); *H01L 33/007* (2013.01)

(58) Field of Classification Search  
    CPC ........ H01L 33/04; H01L 33/32; H01L 33/007  
    USPC ................ 257/13, 211, 14, 24, 103, E33.008; 438/45, 142, 31  
    See application file for complete search history.

(56) References Cited

U.S. PATENT DOCUMENTS

| | | | |
|---|---|---|---|
| 6,649,287 B2 | 11/2003 | Weeks, Jr. et al. | |
| 6,956,250 B2 | 10/2005 | Borges et al. | |
| 7,233,028 B2 | 6/2007 | Weeks et al. | |
| 7,700,940 B2 | 4/2010 | Sakai et al. | |
| 8,344,417 B2 | 1/2013 | Weeks, Jr. et al. | |
| 2009/0078961 A1 | 3/2009 | Choi | |
| 2010/0273281 A1 | 10/2010 | Chakraborty et al. | |
| 2013/0234107 A1 | 9/2013 | Cheon et al. | |

OTHER PUBLICATIONS

Korotkov et al., "Codoping of wide gap epitaxial III-Nitride semiconductors," Opto-Electronics Review,10(4), 2002, pp. 243-249.

Haeberlen et al., "Dislocation reduction in MOVPE grown GaN Layers on (111)Si using SiNx and AlGaN layers," Journal of Physics: Conference Series, 209(1), Feb. 2010, pp. 1-4.

Drechsel et al., "Strain controlled growth of crack-free GaN with low defect density on silicon (111) substrate," Journal of Crystal Growth, vol. 315, Issue 1, Jan. 15, 2011, pp. 211-215.

Drechsel et al., "Impact of buffer growth on crystalline quality of GaN grown on Si(111) substrates," Physica Status Solidi (a), vol. 209, Issue 3, Mar. 2012, pp. 427-430.

(Continued)

*Primary Examiner* — Long K Tran  
*Assistant Examiner* — Dzung Tran  
(74) *Attorney, Agent, or Firm* — Jianq Chyun IP Office

(57) ABSTRACT

A semiconductor structure including a silicon substrate, a nucleation layer and a plurality of multi-layer sets is provided. The nucleation layer is disposed on the silicon substrate. The multi-layer sets are stacked over the nucleation layer, and each of the multi-layer sets includes a plurality of first sub-layers and a plurality of second sub-layers stacked alternately. A material of the first sub-layers and the second sub-layers includes Al-containing III-V group compound, wherein an average content of aluminum of the multi-layer sets decreases as a minimum distance between each of the multi-layer sets and the silicon substrate increases, and an aluminum content of the first sub-layers is different from an aluminum content of the second sub-layers.

20 Claims, 17 Drawing Sheets

(56) References Cited

OTHER PUBLICATIONS

Raghavan et al, "Growth stresses and cracking in GaN films on (111) Si grown by metalorganic chemical vapor deposition. II. Graded AlGaN buffer layers," Journal of Applied Physics, vol. 98 Issue:2, 2005, pp. 023515-1-023515-8.

Raghavan et al., "Effect of AlN interlayers on growth stress in GaN layers deposited on (111) Si," Applied Physics Letters 87, Sep. 2005, pp. 14210-1-14210-3.

Raghavan et al., "Growth stresses and cracking in GaN films on (111) Si grown by metal-organic chemical-vapor deposition. I. AlN buffer layers," Journal of Applied Physics, vol. 98 Issue:2, 2005, pp. 023514-1-023514-9.

thickness direction of first doped semiconductor layer thickness direction of first doped semiconductor layer

US 9,112,077 B1

SEMICONDUCTOR STRUCTURE

TECHNICAL FIELD

The technical field relates to a semiconductor structure.

BACKGROUND

Light-emitting diodes (LEDs) are semiconductor devices made of a compound semiconductor material containing III-V group elements, for example, GaN, GaP, GaAs, and the like. The lifespan of the LED is up to 100,000 hours, and has advantages of quick response speed (approximately $10^{-9}$ seconds), small volume, power-saving, low pollution, high reliability, and ease mass production. Thus, the LEDs have been intensively used in many fields, for example, illumination device, traffic lights, cellular phones, scanners, fax machines, etc.

Currently, sapphire ($Al_2O_3$) substrates are often used in GaN-based LEDs. Thermal conductivity of sapphire substrates is concerned when GaN based LEDs are fabricated over the sapphire substrates. Accordingly, silicon substrates with better thermal conductivity are gradually used in fabrication of GaN-based LEDs. In addition to good thermal conductivity, the silicon substrates have many advantages, such as high electrical conduction, large wafer size and low cost.

The semiconductor device having the silicon substrate faces issues that the lattices and the thermal expansion coefficients (CTE) mismatch between a first doped semiconductor layer (i.e. GaN-based III-V compound) and the silicon substrate. The semiconductor device suffers a stress resulted from the mismatches of the lattices and the thermal expansion coefficients. Due to the stress, the semiconductor device bends severely and possibility of crack increases. Therefore, it is a great challenge in reducing the crack possibility.

SUMMARY

In this disclosure, the crack possibility of the semiconductor structure can be minimized.

One of exemplary embodiments provides a semiconductor structure. The semiconductor structure including a silicon substrate, a nucleation layer and a plurality of multi-layer sets is provided. The nucleation layer is disposed on the silicon substrate. The multi-layer sets are stacked over the nucleation layer, and each of the multi-layer sets includes a plurality of first sub-layers and a plurality of second sub-layers stacked alternately. A material of the first sub-layers and the second sub-layers includes Al-containing III-V group compound, wherein an average aluminum content of the multi-layer sets decreases as a minimum distance between each of the multi-layer sets and the silicon substrate increases, and an aluminum content of the first sub-layers is different from an aluminum content of the second sub-layers.

In order to make the disclosure comprehensible, several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF EMBODIMENTS

Because the differences between the mismatches of the thermal expansion coefficients (CTE) and the lattices between the. GaN-based III-V compound and the silicon substrate reaches 54% and 17%, a large number of defects might generate easily during the manufacturing process, so that quality of the conventional semiconductor structure is influenced accordingly. In order to minimize the crack possibility, several semiconductor structures are proposed below.

Figure 1:
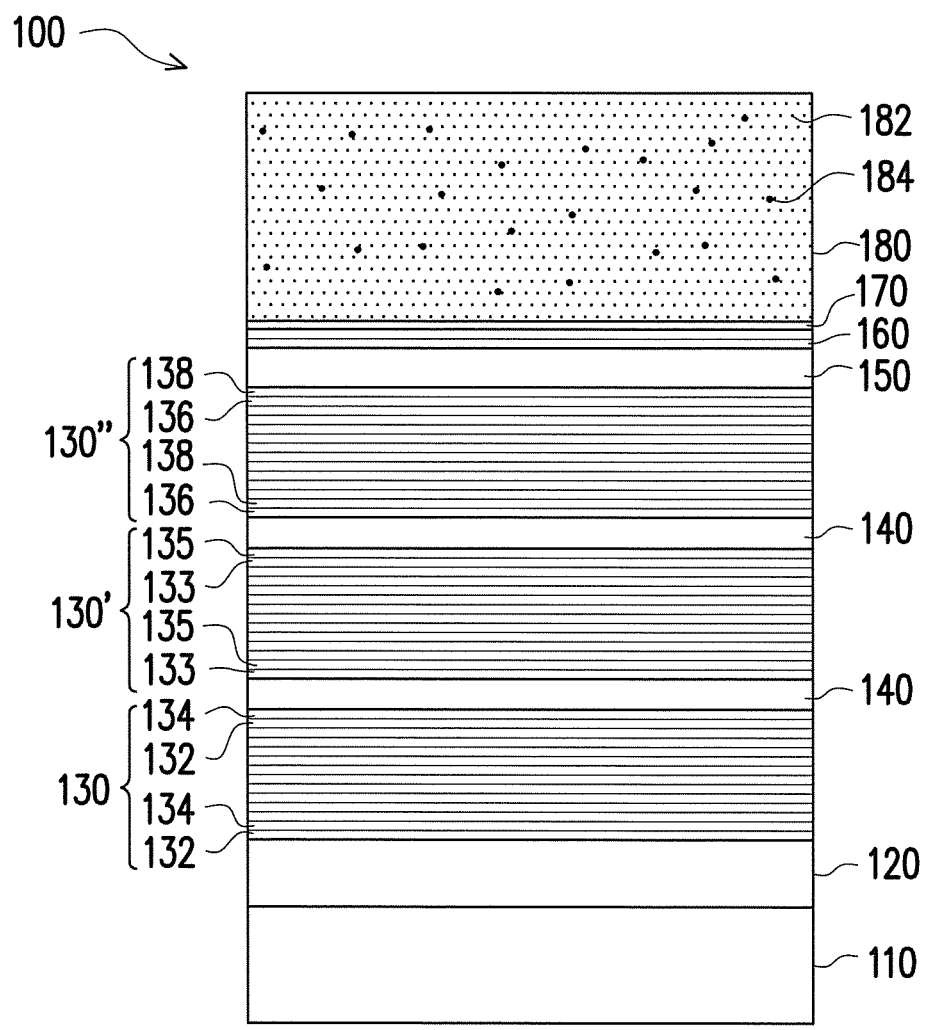
FIG. 1 is a cross-sectional view schematically illustrating a semiconductor structure according to one embodiment of the disclosure.

FIG. 1 is a cross-sectional view schematically illustrating a semiconductor structure according to one embodiment of the disclosure. Referring to FIG. 1, a semiconductor structure 100 of the embodiment includes a silicon substrate 110, a nucleation layer 120, a plurality of multi-layer sets 130, 130' and 130" and a first doped semiconductor layer 180. The nucleation layer 120 is disposed on the silicon substrate 110.

In the embodiment, the nucleation layer 120 comprises an aluminium nitride (AlN) layer, and a thickness of the nucleation layer 120 is about 0.1 µm to about 0.3 µm.

The multi-layer sets 130, 130' and 130" are stacked over the nucleation layer 120 sequentially, the multi-layer sets 130 includes a plurality of first sub-layers 132 and a plurality of second sub-layers 134 stacked alternately, the multi-layer sets 130' includes a plurality of first sub-layers 133 and a plurality of second sub-layers 135 stacked alternately, and the multi-layer sets 130" includes a plurality of first sub-layers 136 and a plurality of second sub-layers 138 stacked alternately. The semiconductor structure 100 further includes at least one first interlayer 140 disposed between two of the multi-layer sets 130, 130' and 130" adjacent to each other. In the embodiment, one of the first interlayer 140 is disposed between the multi-layer set 130 and the multi-layer set 130', and the other first interlayer 140 is disposed between the multi-layer set 130' and the multi-layer set 130". In the embodiment, each of the first interlayer 140 comprises an aluminium nitride (AlN) layer, but the first interlayer 140 is not limited thereto, other suitable material may be adapted in this disclosure. As shown in FIG. 1, the semiconductor structure 100 includes three multi-layer sets 130, 130' and 130" and two first interlayers 140. It is noted that the amount of the first sub-layers 132, 133 and 136 and the second sub-layers 134, 135 and 138 of the multi-layer sets 130, 130' and 130" shown in FIG. 1 is just schematic, the multi-layer sets 130, 130' and 130" can have 10~15 pairs of the first sub-layers 132, 133 and 136 and the second sub-layers 134, 135 and 138, respectively. A thickness of the multi-layer set 130, 130' or 130" is about 0.6 µm to about 1 µm, for example, 0.8 µm. Certainly, the amounts of the multi-layer sets 130, 130' and 130", the first interlayers 140, the first sub-layers 132, 133, 136 and the second sub-layers 134, 135 and 138 are not limited thereto, other suitable amounts may be adapted in this disclosure.

Figure 2A:
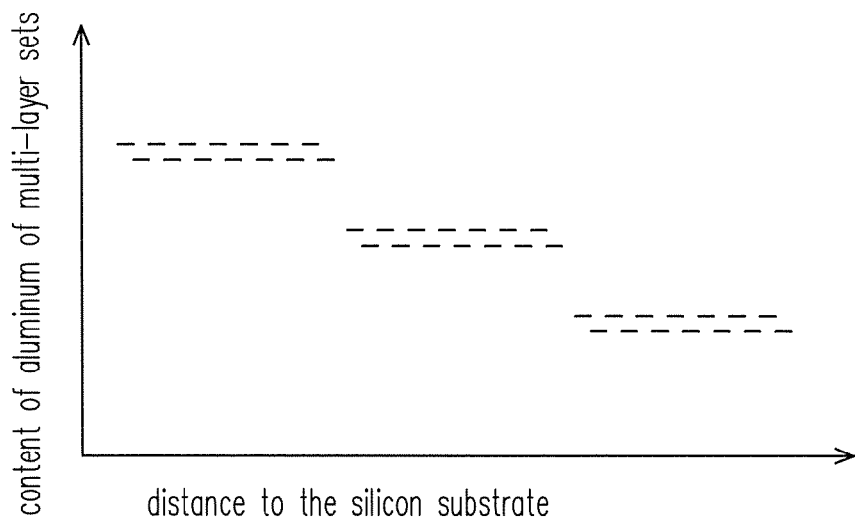
FIG. 2A is a schematic view illustrating a variation of an aluminum content of multi-layer sets of the semiconductor structure of FIG. 1 along a thickness direction of the multi-layer sets.

A material of the first sub-layers 132, 133 and 136 and the second sub-layers 134, 135 and 138 includes Al-containing III-V group compound, for example, AlGaN. FIG. 2A is a schematic view illustrating a variation of an aluminum content of multi-layer sets of the semiconductor structure of FIG. 1 along a thickness direction of the multi-layer sets. In FIG. 2A, x axis represents a distance to the silicon substrate 110, and y axis represents the content of aluminum. Referring to FIG. 2A, an average aluminum content of the multi-layer sets 130, 130' and 130" decreases as a minimum distance between each of the multi-layer sets 130, 130' and 130" and the silicon substrate 110 increases. In addition, in each of the multi-layer sets 130, 130' and 130", the content of aluminum of the first sub-layers 132, 133 or 136 is constant, the content of aluminum of the second sub-layers 134, 135 or 138 is constant, and the content of aluminum of the first sub-layers 132, 133 or 136 is higher than the content of aluminum of the second sub-layers 134, 135 or 138.

The content of aluminum of the second sub-layer 134 in the relatively lower multi-layer set 130 which is close to the silicon substrate 110 is not less than that of the first sub-layers 133 in the relatively upper multi-layer set 130', and the content of aluminum of the second sub-layer 135 in the multi-layer set 130' is not less than that of the first sub-layers 136 in the multi-layer set 130". As shown in FIG. 2A, the content of aluminum of the second sub-layers 134 in the relatively lower multi-layer set 130 is higher than that of the first sub-layers 133 in the relatively upper multi-layer set 130', and the content of aluminum of the second sub-layer 135 in the multi-layer set 130' is higher than that of the first sub-layers 136 in the multi-layer set 130". Certainly, in another embodiment, the content of aluminum of the second sub-layer 134 or 135 in the relatively lower multi-layer set 130 or 130' also can be equal to that of the first sub-layers 133 or 136 in the relatively upper multi-layer set 130' or 130".

Figure 2B:
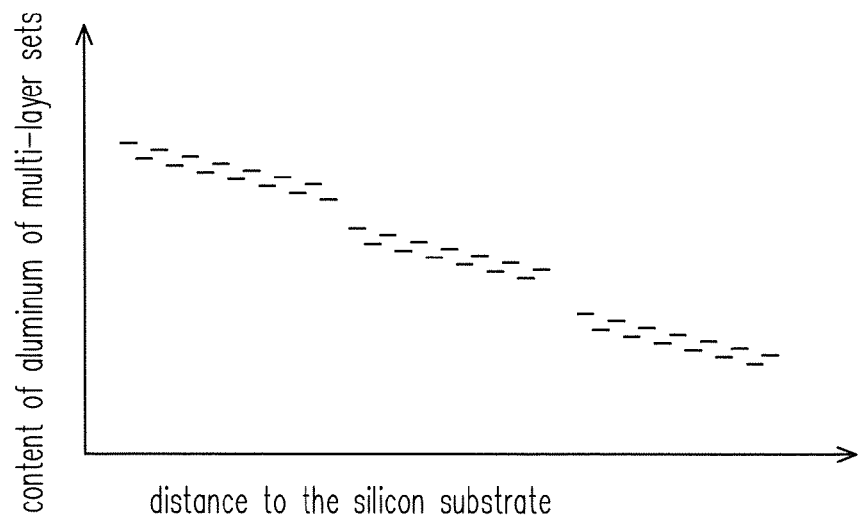
FIG. 2B-FIG. 2F are schematic views illustrating variations of contents of aluminum of multi-layer sets of the semiconductor structures of other embodiments along a thickness direction of the multi-layer sets.
Figure 2C:
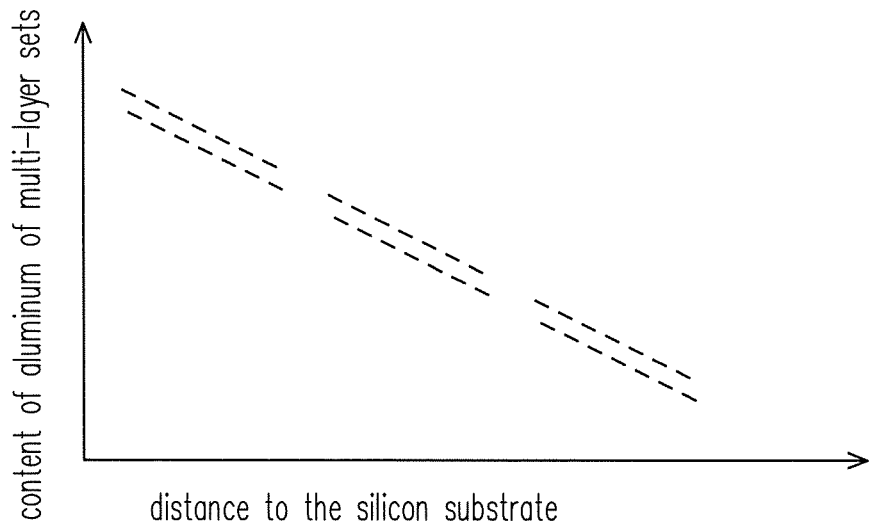
Figure 2D:
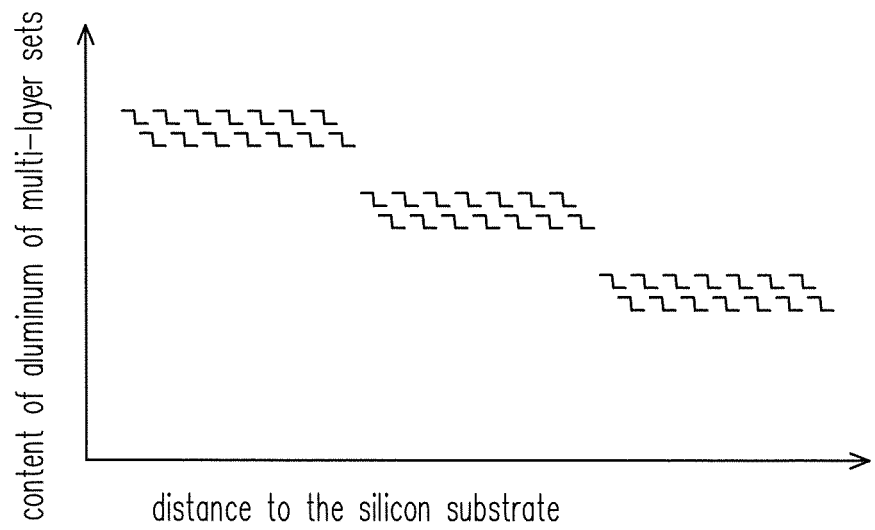
Figure 2E:
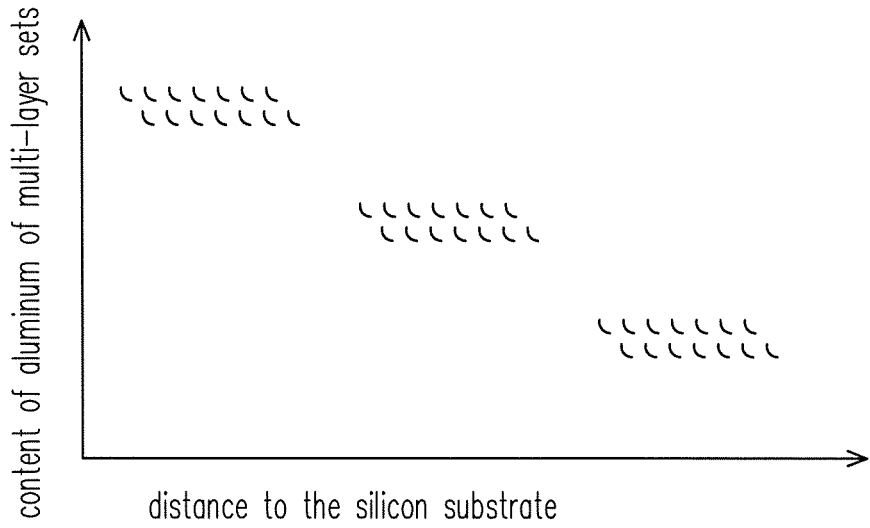
Figure 2F:
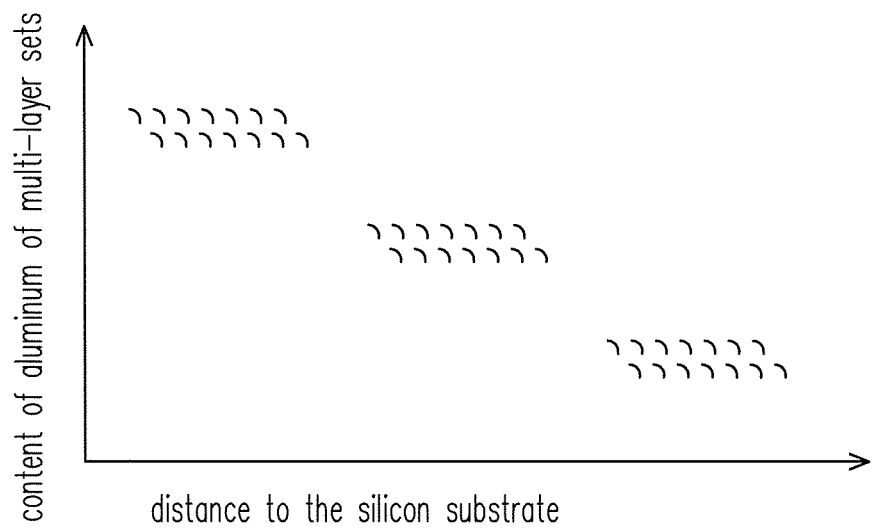

Of course, the variation of the content of aluminum in multi-layer sets 130, 130' and 130" is not limited thereto. FIG. 2B-FIG. 2F are schematic views illustrating variations of contents of aluminum of multi-layer sets of the semiconductor structures of other embodiments along a thickness direction of the multi-layer sets. Referring to FIG. 2B, x axis represents a distance to the silicon substrate, and y axis represents the content of aluminum. The content of aluminum of each first sub-layer 132, 133 or 136 and the content of aluminum of each second sub-layer 134, 135 or 138 are constant. However, in each of the multi-layer sets 130, 130' and 130", the content of aluminum of the first sub-layers 132, 133 or 136 and the content of aluminum of the second sub-layers 134, 135 or 138 decrease stepwise along a thickness direction of the multi-layer sets. Referring to FIG. 2C, the difference between FIG. 2B and FIG. 2C is that the content of aluminum in each first sub-layer 132, 133 or 136 and the content of aluminum each sub-layer 134, 135 or 138 of FIG. 2C decrease gradually along a thickness direction of the multi-layer sets. Referring to FIG. 2D, the difference between FIG. 2A and FIG. 2D is, in each first sub-layer 132, 133 or 136 and each sub-layer 134, 135 or 138 of FIG. 2D, the variation tendency of the content of aluminium along a thickness direction of the multi-layer sets is a part of ladder-shaped, (i.e. keeping a constant, dropping rapidly and then keeping a lower constant). Referring to FIG. 2E, the difference between FIG. 2A and FIG. 2E is, in each first sub-layer 132, 133 or 136 and each sub-layer 134, 135 or 138 of FIG. 2E, the variation tendency of the content of aluminium is an exponential profile which drops rapidly first and then drops slowly. Referring to FIG. 2F, the variation tendency of the content of aluminium in each first sub-layer 132, 133 or 136 and each sub-layer 134, 135 or 138 is an exponential profile which drops slowly first and then drops rapidly.

According to the above configurations of the multi-layer sets 130, 130' and 130", for example each of the multi-layer sets 130, 130' and 130" having the first sub-layers 132, 133 or 136 and the second sub-layers 134, 135 or 138 stacked alternately, the plurality of multi-layer sets 130, 130' and 130" stacked with one another, and the variation of the content of aluminum in the multi-layer sets 130, 130' and 130", the stress exists between the silicon substrate 110 and the first doped semiconductor layer 180 can be lowered, so that the crack possibility of the semiconductor structure 100 is capable of being decreased.

Figure 2G:
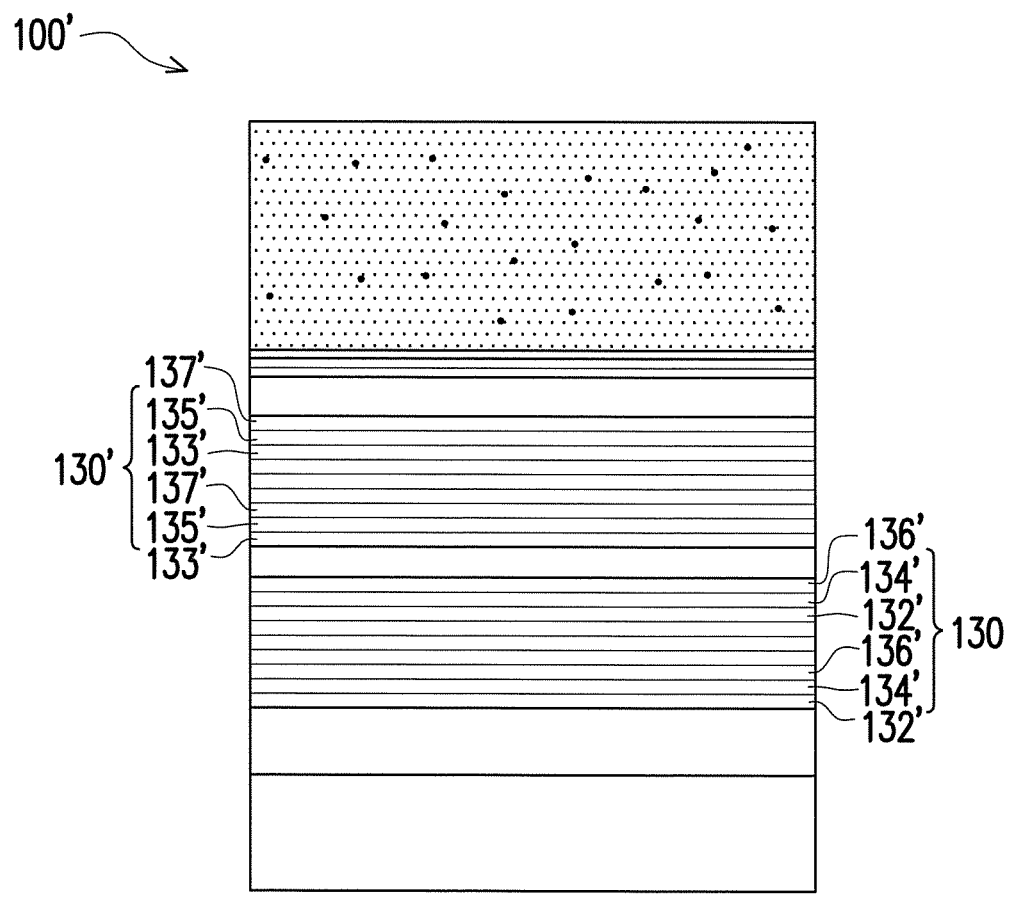
FIG. 2G is a cross-sectional view schematically illustrating a semiconductor structure according to one embodiment of the disclosure.

FIG. 2G is a cross-sectional view schematically illustrating a semiconductor structure according to one embodiment of the disclosure. Referring to FIG. 2G, the main difference between FIG. 1 and FIG. 2G is, a semiconductor structure 100' in FIG. 2G includes two multi-layer sets 130 and 130', the multi-layer set 130 includes a plurality of first sub-layers 132', a plurality of second sub-layers 134' and a plurality of third sub-layers 136' stacked alternately, and the multi-layer set 130' includes a plurality of first sub-layers 133', a plurality of second sub-layers 135' and a plurality of third sub-layers 137' stacked alternately. It is noted that the amount of the first sub-layers 132' and 133', the second sub-layers 134' and 135' and the third sub-layers 136' and 137' of the multi-layer sets 130 and 130' shown in FIG. 2G is just schematic.

Figure 2H:
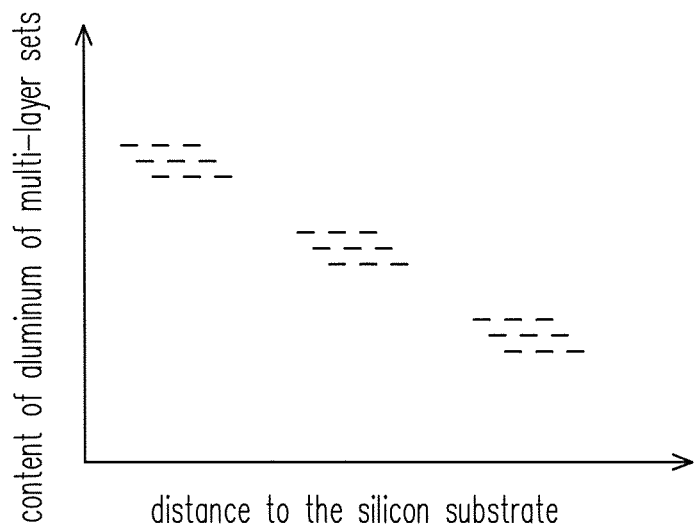
FIG. 2H is a schematic view illustrating a variation of an aluminum content of multi-layer sets of the semiconductor structure of FIG. 2G along a thickness direction of the multi-layer sets.
Figure 2I:
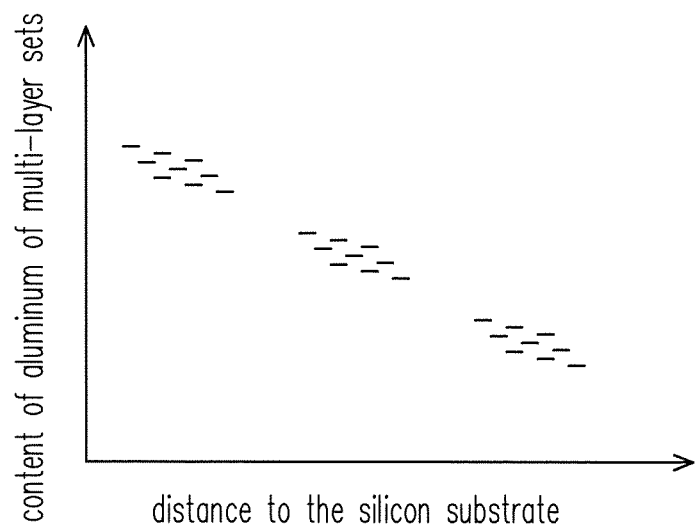
FIG. 2I-FIG. 2M are schematic views illustrating variations of contents of aluminum of multi-layer sets of the semiconductor structures of other embodiments along a thickness direction of the multi-layer sets.
Figure 2J:
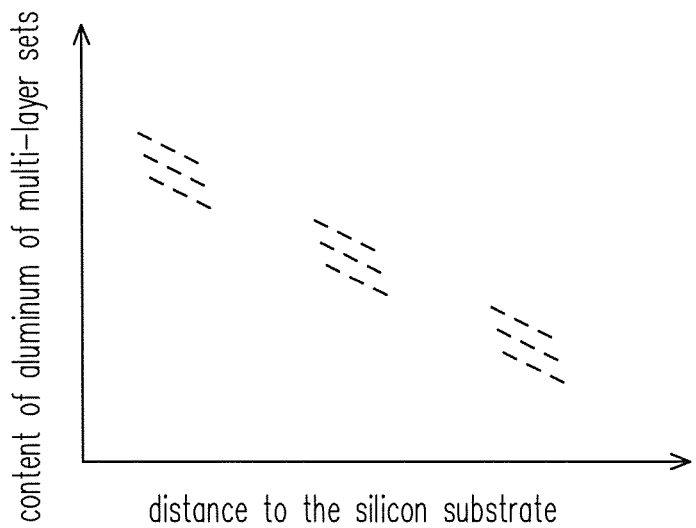
Figure 2K:
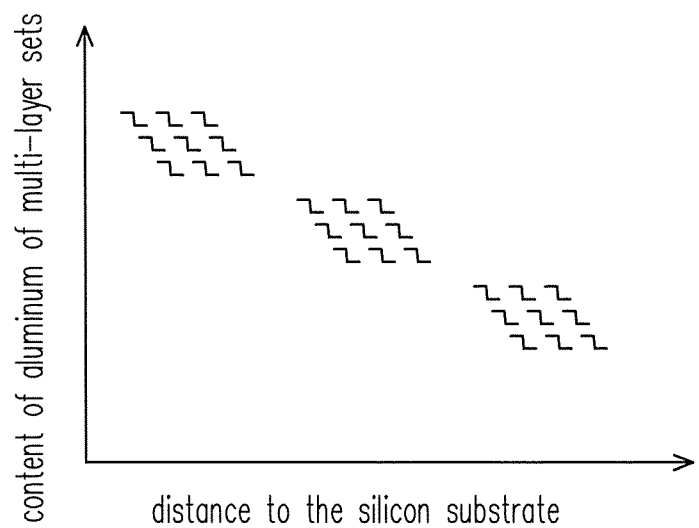
Figure 2L:
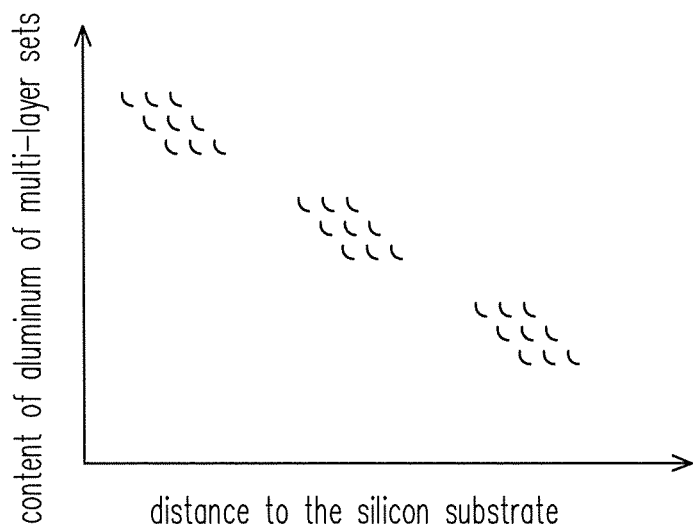
Figure 2M:
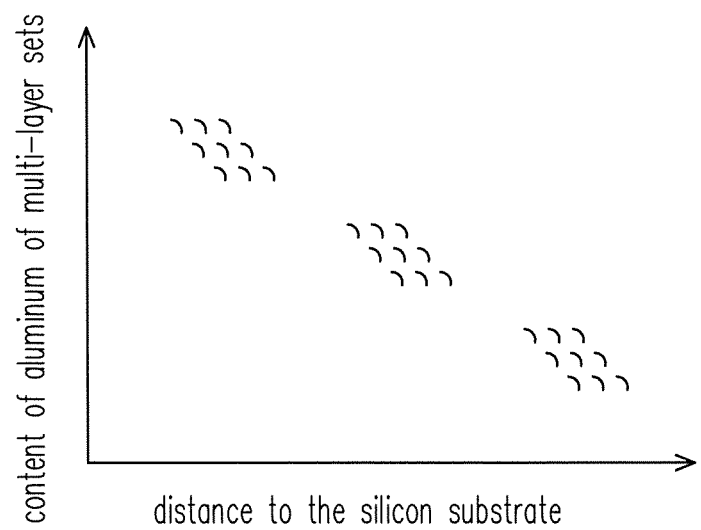

A material of the first sub-layers 132' and 133', the second sub-layers 134' and 135' and the third sub-layers 136' and 137' includes Al-containing III-V group compound, for example, AlGaN. FIG. 2H is a schematic view illustrating a variation of an aluminum content of multi-layer sets of the semiconductor structure of FIG. 2G along a thickness direction of the multi-layer sets. Referring to FIG. 2H, in each of the multi-layer sets 130 and 130', the content of aluminum of the first sub-layers 132' or 133', the content of aluminum of the second sub-layers 134' or 135' and the content of aluminum of the third sub-layers 136' or 137' are constant. In each of the multi-layer sets 130 and 130', the content of aluminum of the first sub-layers 132' or 133' is higher than the content of aluminum of the second sub-layers 134' or 135', and the content of aluminum of the second sub-layers 134' or 135' is higher than the content of aluminum of the third sub-layers 136' or 137'.

Certainly, the variation of the content of aluminum in multi-layer sets 130 and 130' is not limited thereto. FIG. 2I-FIG. 2M are schematic views illustrating variations of contents of aluminum of multi-layer sets of the semiconductor structures of other embodiments along a thickness direction of the multi-layer sets. The variation tendencies of contents of aluminum of multi-layer sets of the semiconductor structures in FIG. 2I-FIG. 2M are similar to those in FIG. 2B-FIG. 2F. Therefore, it is not repeated here.

Please back to FIG. 1, in the multi-layer set 130 which is close to the nucleation layer 120, one of the first sub-layers 132 physically contacts the nucleation layer 120, and one of the second sub-layers 134 physically contacts the lower first interlayer 140. In the middle multi-layer set 130', one of the first sub-layers 133 physically contacts the lower first interlayer 140, and one of the second sub-layers 135 physically contacts the upper first interlayer 140. In the multi-layer set 130" which is far away from the nucleation layer 120, one of the first sub-layers 136 physically contacts the upper first interlayer 140, and one of the second sub-layers 138 physically contacts a mask layer 150 disposed on the multi-layer set 130". In the embodiment, the mask layer 150 comprises a silicon nitride (SiN) layer, but the mask layer 150 is not limited thereto, other suitable material may be adapted in this disclosure.

The first doped semiconductor layer 180 is disposed over the mask layer 150. In the embodiment, the first doped semiconductor layer 180 is an n-type nitride semiconductor layer, for example, a n-GaN layer, but the first doped semiconductor layer 180 is not limited thereto, other proper material such as n-AlGaN, and so on may be adapted in this disclosure. A thickness of the first doped semiconductor layer 180 is about 0.5 μm to about 1.5 μm. The first doped semiconductor layer 180 comprises a first dopant 182 and a second dopant 184 distributed therein, and an atom radius of the first dopant 182 is smaller than that of the second dopant 184. The first dopant 182 comprises at least one element of group IV A, and the second dopant 184 comprises at least one element of groups II A or III A. In this embodiment, the first dopant 182 is silicon, and the second dopant 184 is magnesium or indium, for example. However, the first dopant 182 and the second dopant 184 are not limited thereto, other suitable elements may be used in the disclosure.

The semiconductor structure 100 further includes a second interlayer 160 and an undoped semiconductor layer 170. The second interlayer 160 is disposed between the mask layer 150 and the first doped semiconductor layer 180. The undoped semiconductor layer 170 is disposed between the first doped semiconductor layer 180 and the second interlayer 160. In the embodiment, the second interlayer 160 comprises at least one Al-containing III-V group compound layer, for example, two AlGaN layers with different contents of aluminum. The undoped semiconductor layer 170 comprises a nitride layer, for example, an undoped n-GaN layer.

In this embodiment, the nucleation layer 120, the multi-layer sets 130, 130' and 130", the first interlayers 140, the mask layer 150, the second interlayer 160, the undoped semiconductor layer 170 and the first doped semiconductor layer 180 are grown over the silicon substrate 110 by metal organic chemical vapor deposition (MOCVD) process. However, the fabrication process is not limited to the above-mentioned MOCVD process, other suitable processes may be adapted in this disclosure.

Because the growing parameters of magnesium are similar to those of n-GaN, in the embodiment, it takes magnesium as the second dopant. Certainly, the second dopant is not limited thereto. Atom radiuses of indium, magnesium and gallium are about 155 pm, 150 pm, 130 pm, respectively. The lattice constant of the first doped semiconductor layer 180 can be modified by doping element whose atom radius is larger than that of gallium (for example, magnesium or indium), so that the stress exists between the multi-layer sets 130, 130' and 130" and the first doped semiconductor layer 180 can be lowered. Therefore, the crack possibility of the semiconductor structure 100 can be lowered.

The stress between the multi-layer sets 130, 130' and 130" and the first doped semiconductor layer 180 and the conductivity of the first doped semiconductor layer 180 would be influenced by the content of the second dopant 184 (i.e. magnesium). In detail, the stress between the multi-layer sets 130, 130' and 130" and the first doped semiconductor layer 180 would be decreased by the high content of the second dopant 184 so that no crack is generated. However, the conductivity of the first doped semiconductor layer 180 is decreased. On the contrary, the conductivity of the first doped semiconductor layer 180 is increased by the low content of the second dopant 184. However, the stress between the multi-layer sets 130, 130' and 130" and the first doped semiconductor layer 180 is increased, and cracks are generated easily. Therefore, the content of the second dopant 184 could be limited in a range so as to strike a balance between the stress and the conductivity of the first doped semiconductor layer 180.

A content of the first dopant 182 doped within the first doped semiconductor layer 180 is between about $1\times10^{16}/cm^3$ and about $1\times10^{20}/cm^3$, a content of the second dopant 184 doped within the first doped semiconductor layer 180 is between about $1\times10^{16}/cm^3$ and about $1\times10^{20}/cm^3$, and a ratio of a content of the second dopant 184 to a content of the first dopant 182 in the first doped semiconductor layer 180 is about 1:1 to about 1:10000. In one embodiment, the contents of the first dopant 182 and the second dopant 184 doped within the first doped semiconductor layer 180 are between about $1\times10^{17}/cm^3$ and about $1\times10^{19}/cm^3$, respectively. In another preferable embodiment, the contents of the first dopant 182 doped within the first doped semiconductor layer 180 is between about $1\times10^{18}/cm^3$ and about $5\times10^{18}/cm^3$, and the content of the second dopant 184 doped within the first doped semiconductor layer 180 is about $1\times10^{18}/cm^3$.

It is noted that FIG. 1 just schematically shows the first doped semiconductor layer 180 has the first dopant 182 and the second dopant 184. In fact, the first dopant 182 and the second dopant 184 are not distributed uniformly in the first doped semiconductor layer 180.

Figure 3:
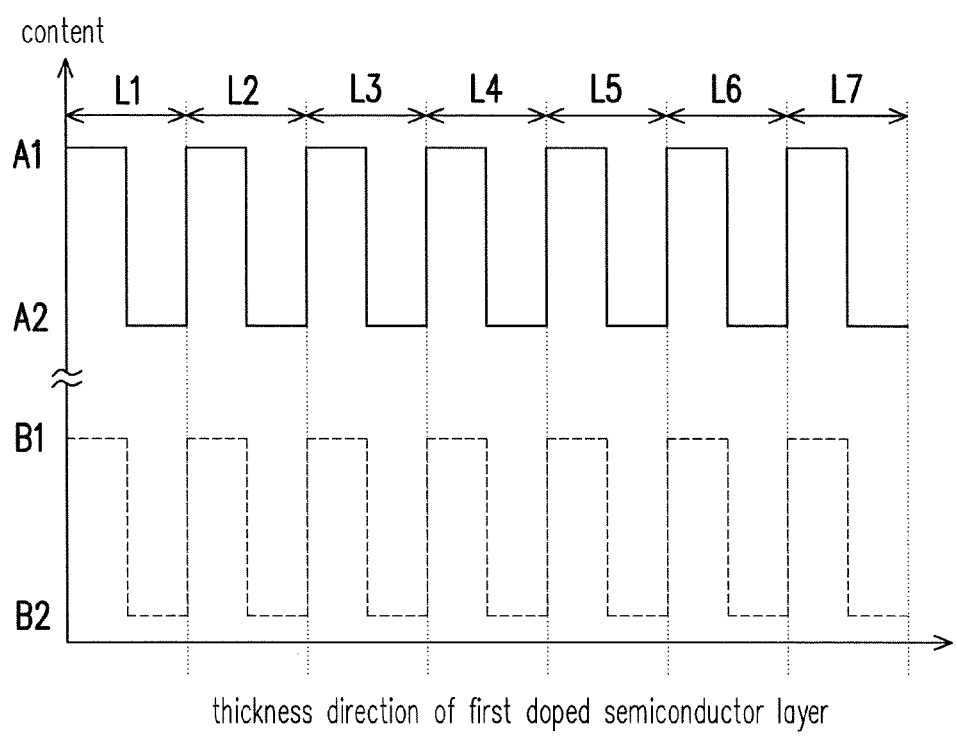
FIG. 3 is a schematic view illustrating variations of contents of a first dopant and a second dopant of a first doped semiconductor layer of the semiconductor structure of FIG. 1 along a thickness direction of the first doped semiconductor layer.

FIG. 3 is a schematic view illustrating variations of contents of a first dopant and a second dopant of a first doped semiconductor layer of the semiconductor structure of FIG. 1 along a thickness direction of the first doped semiconductor layer. Referring to FIG. 3, x axis represents a thickness direction of the first doped semiconductor layer 180, and y axis represents the contents of the first dopant 182 and the second dopant 184. The solid line represents the first dopant 182, and the dotted line represents the second dopant 184. As shown in FIG. 3, the first dopant 182 and the second dopant 184 are doped within the first doped semiconductor layer 180 in a modulation manner. In detail, in FIG. 3, the first doped semiconductor layer 180 is divided to several sections L1, L2 ... L7 along a thickness direction, the content of the first dopant 182 of the first doped semiconductor layer 180 has two constant values A1 and A2 in each section L1, L2 ... or L7, and A1 is larger than A2. In each of the sections L1-L7, the content of the first dopant 182 is kept as A1 in a part of the section, and the content of the first dopant 182 is kept as A2 in the other part of the section. Similarly, the content of the second dopant 184 has two constant values B1 and B2, and B1 is larger than B2. In each of the sections L1-L7, the content of the second dopant 184 is kept as B1 in a part of the section, and the content of the second dopant 184 is kept as B2 in the other part of the section. The contents of the first dopant 182 and the second dopant 184 both vary periodically along the thickness direction of the first doped semiconductor layer 180.

Figures 4A, 4B, 4C:
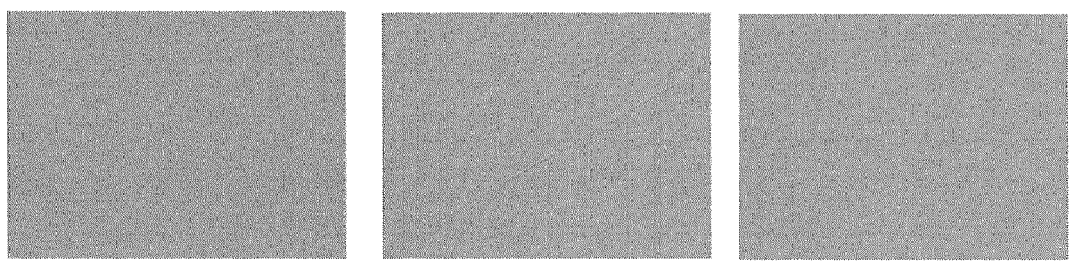
FIG. 4A and FIG. 4B are optical microscope (OM) pictures of top surfaces of first doped semiconductor layers which silicon is doped therein uniformly, respectively.
FIG. 4C is an optical microscope (OM) picture of a top surface of a first doped semiconductor layer whose content of silicon varies periodically along a thickness direction.

FIG. 4A and FIG. 4B are optical microscope (OM) pictures of top surfaces of first doped semiconductor layers which silicon is doped therein unifoii ily but with different doping concentration. A thickness of each of the first doped semiconductor layers is about 1.5 μm. A content of silicon within the first doped semiconductor layer of FIG. 4A is $1\times10^{18}/cm^3$, and a content of silicon within the first doped semiconductor layer of FIG. 4B is $5\times10^{18}/cm^3$. When the content of silicon of the first doped semiconductor layer is about $1\times10^{18}/cm^3$, no crack or defect is generated on the top surface of the first doped semiconductor layer as shown in FIG. 4A. However, when the content of silicon is increased to $5\times10^{18}/cm^3$, many cracks are generated on the top surface of the first doped semiconductor layer as shown in FIG. 4B.

FIG. 4C is an optical microscope (OM) picture of a top surface of a first doped semiconductor layer whose content of silicon varies periodically along a thickness direction. In the first doped semiconductor layer of FIG. 4C, silicon is doped therein in a modulation manner as FIG. 3. In detail, the first doped semiconductor layer is divided to several layers (sections) along the thickness direction, the content of silicon (for example A1) in each of the odd layers of the first doped semiconductor layer is the same, the content of silicon (for example A2) in each of the even layers of the first doped semiconductor layer is the same, and A1 is different from A2. In the first doped semiconductor layer of FIG. 4C, A1 is $5\times10^{18}/cm^3$ and A2 is $1\times10^{18}/c$. The content of silicon varies periodically between $1\times10^{18}/cm^3$ and $5\times10^{18}/cm^3$ along the thickness direction of the first doped semiconductor layer. By this modulation manner, the average content of silicon doped in the first doped semiconductor layer is increased to about $2.5\times10^{18}/cm^3$, and no crack is generated on the top surface of the first doped semiconductor layer as shown in FIG. 4C. In addition, in FIG. 4C, the content of magnesium in the first doped semiconductor layer keeps $1\times10^{19}/cm^3$.

Certainly, a variation tendency of the contents of the first dopant and the second dopant of the first doped semiconductor layer 180 of the semiconductor structure 100 is not limited to FIG. 3. FIG. 5 to FIG. 10 are schematic views illustrating variations of contents of the first dopant and the second dopant of the first doped semiconductor layers of the semiconductor structure of FIG. 1 along the thickness direction of the first doped semiconductor layer. In FIG. 5 to FIG. 10, x axis represents a thickness direction of the first doped semiconductor layer 180, and y axis represents the contents of the first dopant 182 and the second dopant 184. The solid line represents the first dopant 182, and the dotted line represents the second dopant 184.

Figure 5:
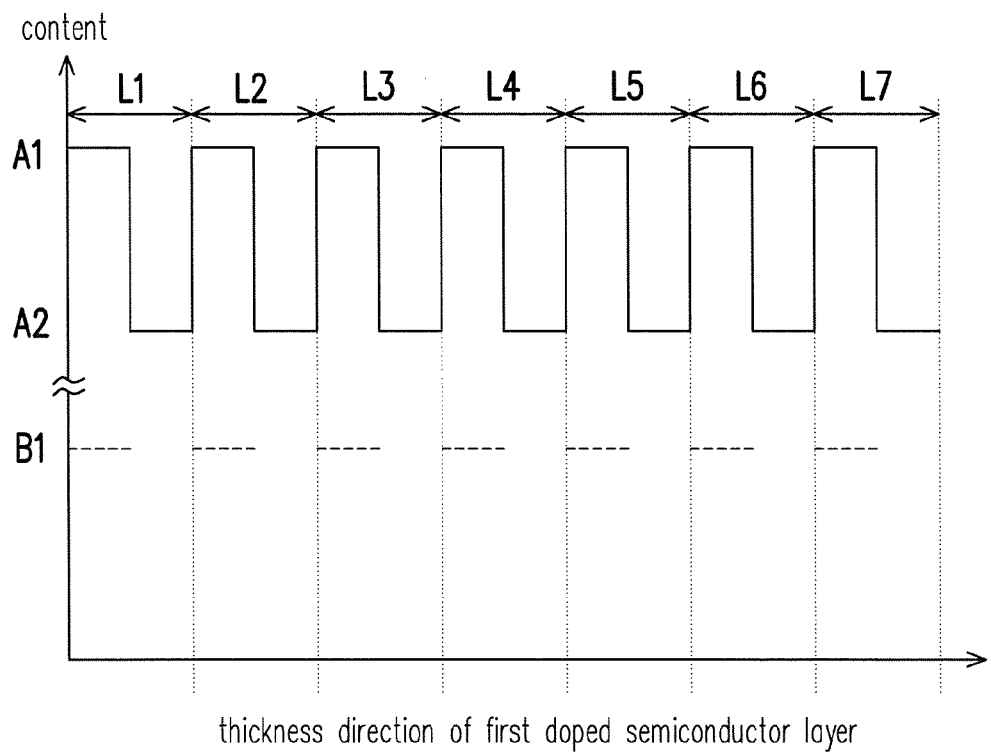
FIG. 5 to FIG. 10 are schematic views illustrating variations of contents of the first dopant and the second dopant of the first doped semiconductor layers of the semiconductor structure of FIG. 1 along the thickness direction of the first doped semiconductor layer.

Please refer to FIG. 5 first, a main difference between FIG. 3 and FIG. 5 is that, in FIG. 5, the content B2 of the second dopant 184 is 0. The content of the second dopant 184 varies periodically between a constant value B1 and 0 along the thickness direction of the first doped semiconductor layer 180. More specifically, when the content of the first dopant 182 is A1, the content of the second dopant 184 is B1. When the content of the first dopant 182 is A2, the content of the second dopant 184 is 0.

Figure 6:
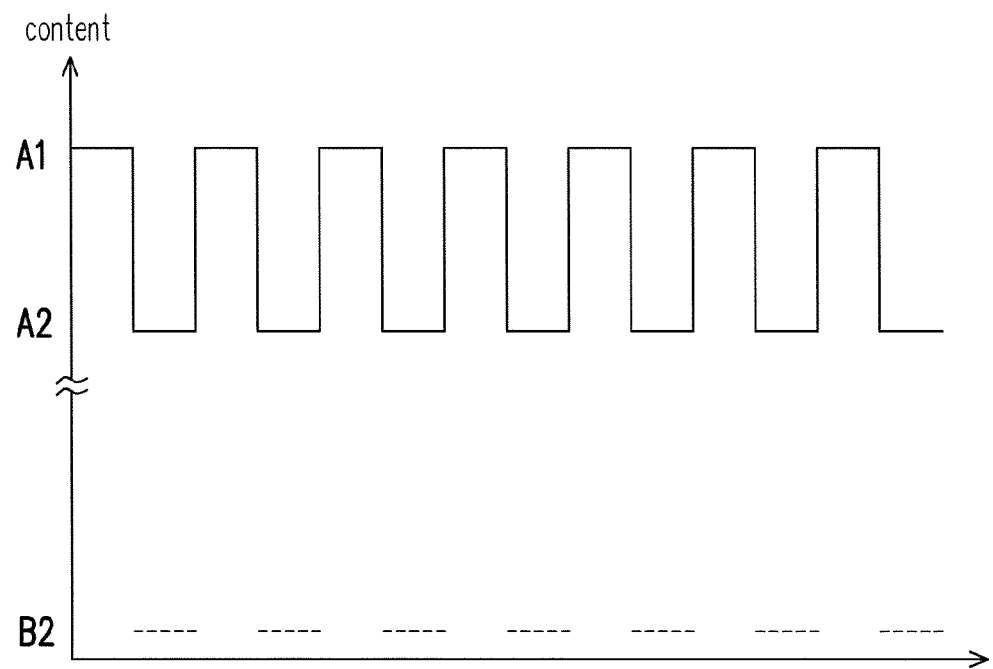

Referring to FIG. 6, a main difference between FIG. 3 and FIG. 6 is that, in FIG. 6, the content B1 of the second dopant 184 is 0. The content of the second dopant 184 varies periodically between a constant value 0 and B2 along the thickness direction of the first doped semiconductor layer 180. More specifically, when the content of the first dopant 182 is A1, the content of the second dopant 184 is 0. When the content of the first dopant 182 is A2, the content of the second dopant 184 is B2.

Figure 7:
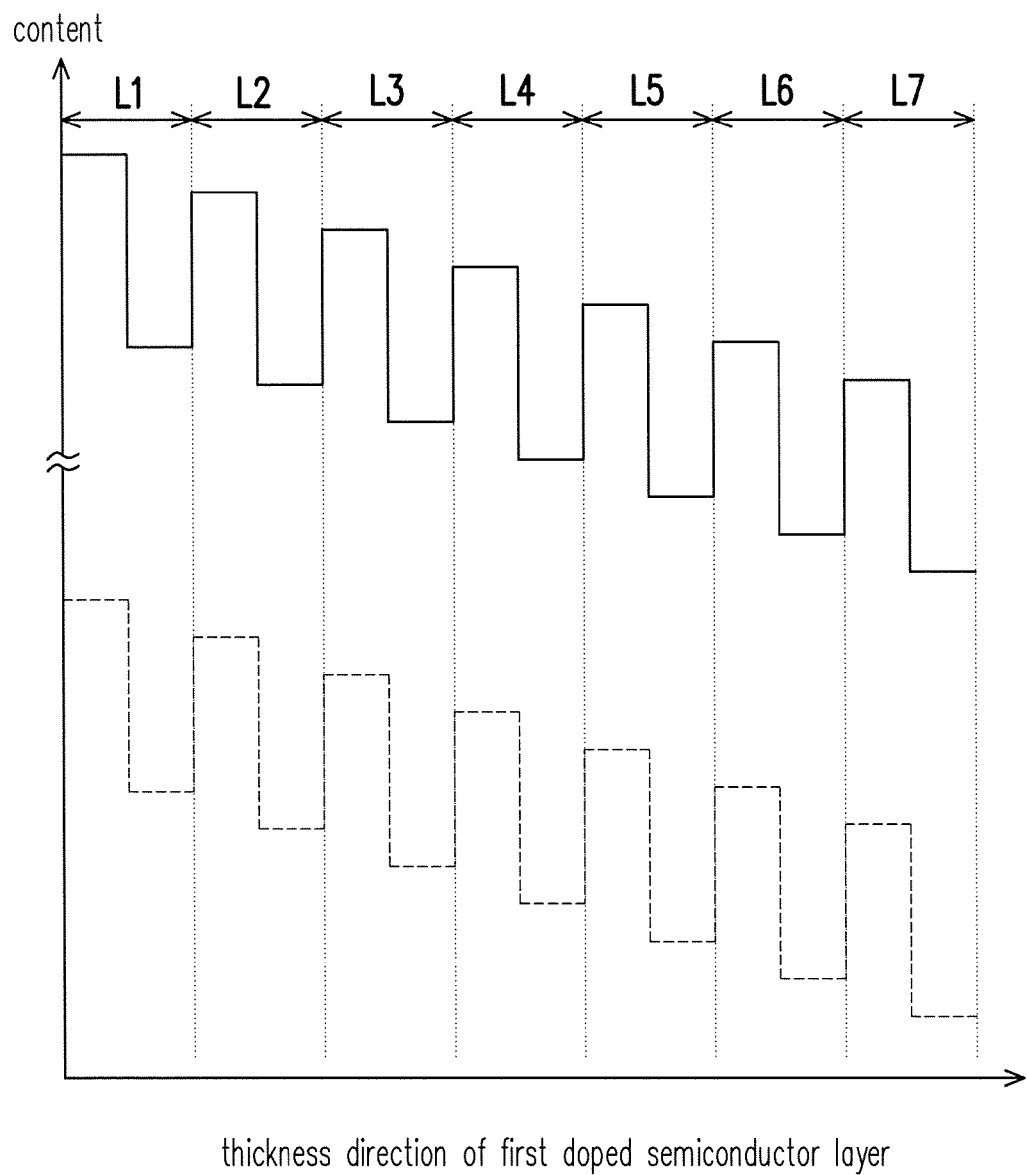

Referring to FIG. 7, the first doped semiconductor layer 180 is divided to several sections L1, L2 ... L7 along a thickness direction. The content of the first dopant 182 has two constant values in each section of the first doped semiconductor layer 180. In other words, in each section, the content of the first dopant 182 keeps one constant value in a part of the section, and then changes to the other constant value in the other part of the section. In addition, the average content of the first dopant 182 in the section which is more close to the silicon substrate 110 (such as section L1) is larger than that of the first dopant 182 in the section which is more far away from the silicon substrate 110 (such as L2, L3 ... or L7). A variation tendency of the content of the first dopant 182 in the first doped semiconductor layer 180 performs as a ladder shape, and that of the content of the second dopant 184 in the first doped semiconductor layer 180 also performs as the similar shape.

Figure 8:
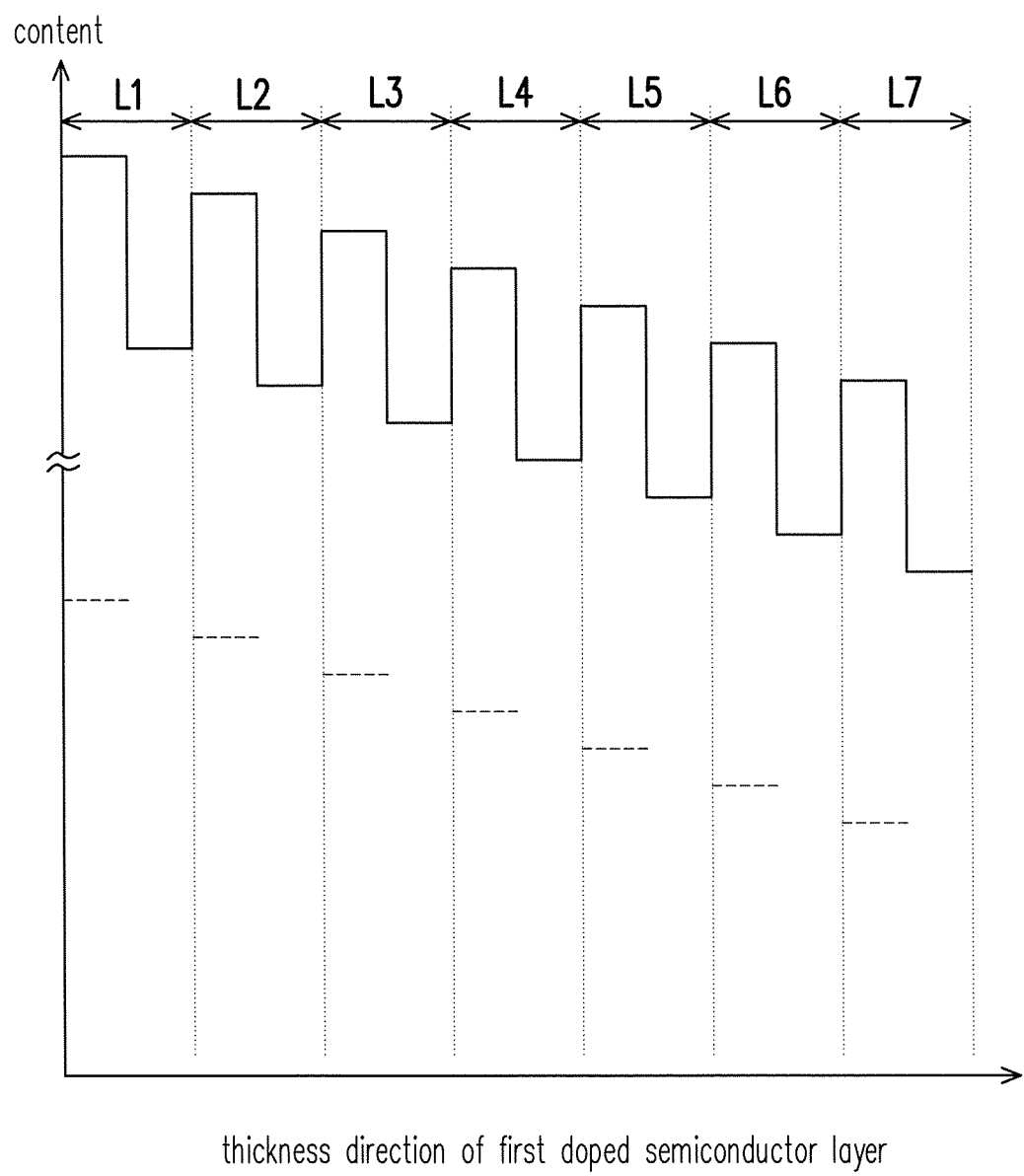

Referring to FIG. 8, a main difference between FIG. 7 and FIG. 8 is that, in FIG. 8, the second dopant 184 is partly doped in the first doped semiconductor layer 180. More specifically, the second dopant 184 is doped in a part of each imaginary layer. In the other part of the imaginary layer, none of the second dopant 184 is doped. In addition, the content of the second dopant 184 in the part of the imaginary layer which is more close to the silicon substrate 110 is larger than that of the second dopant 184 in the part of the imaginary layer which is more far away from the silicon substrate 110.

It should be noted that, although the first dopant 182 and the second dopant 184 are both doped within the first doped semiconductor layer 180 in a modulation manner in the above embodiments, one of the first dopant 182 and the second dopant 184 also can be doped uniformly in other embodiments.

Figure 9:
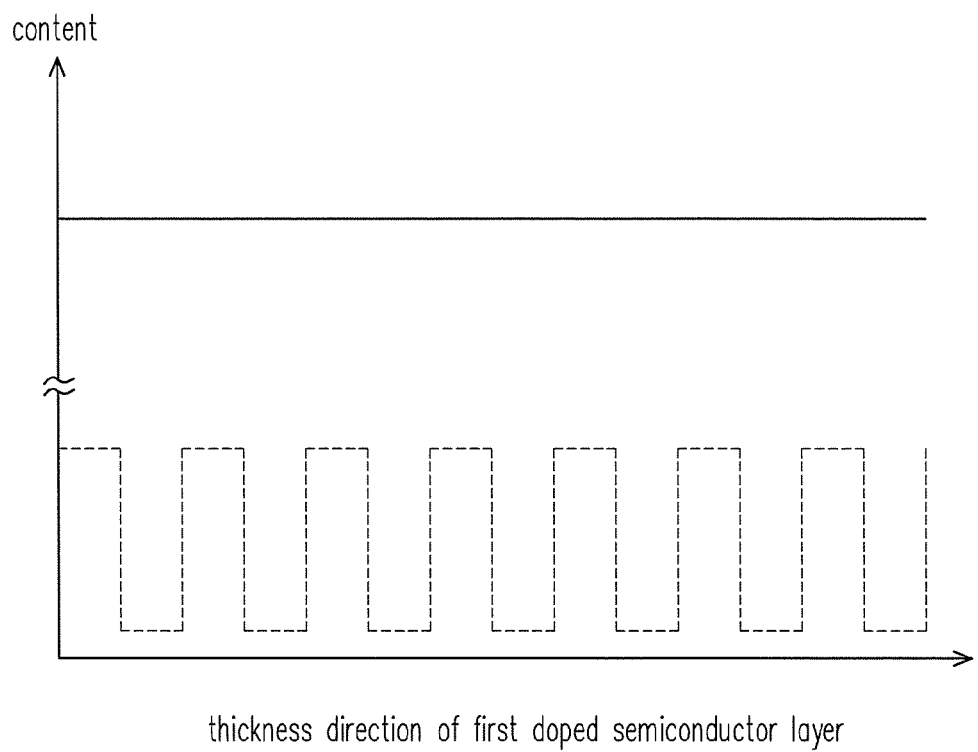
Figure 10:
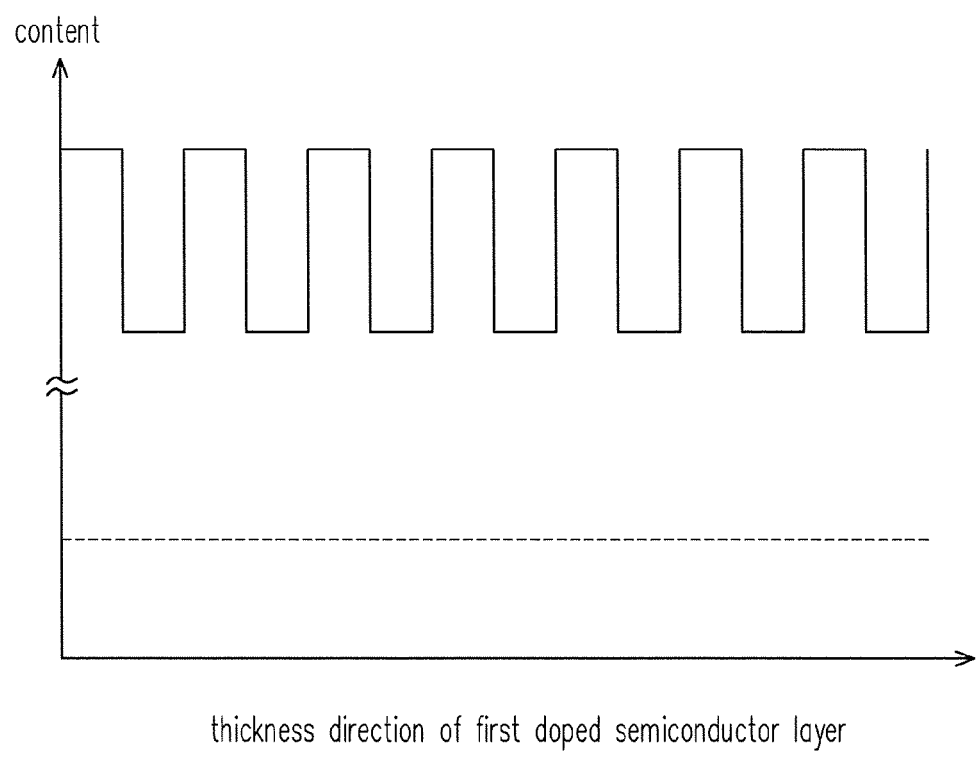

Referring to FIG. 9, a main difference between FIG. 3 and FIG. 9 is that, in FIG. 9, the content of the first dopant 182 in the first doped semiconductor layer 180 is a constant value, so that the content of the first dopant 182 does not vary along the thickness of the first doped semiconductor layer 180. Referring to FIG. 10, a main difference between FIG. 3 and FIG. 10 is that, in FIG. 10, the content of the second dopant 184 in the first doped semiconductor layer 180 is a constant value. That is, the content of the second dopant 184 does not vary along the thickness of the first doped semiconductor layer 180.

Figure 11:
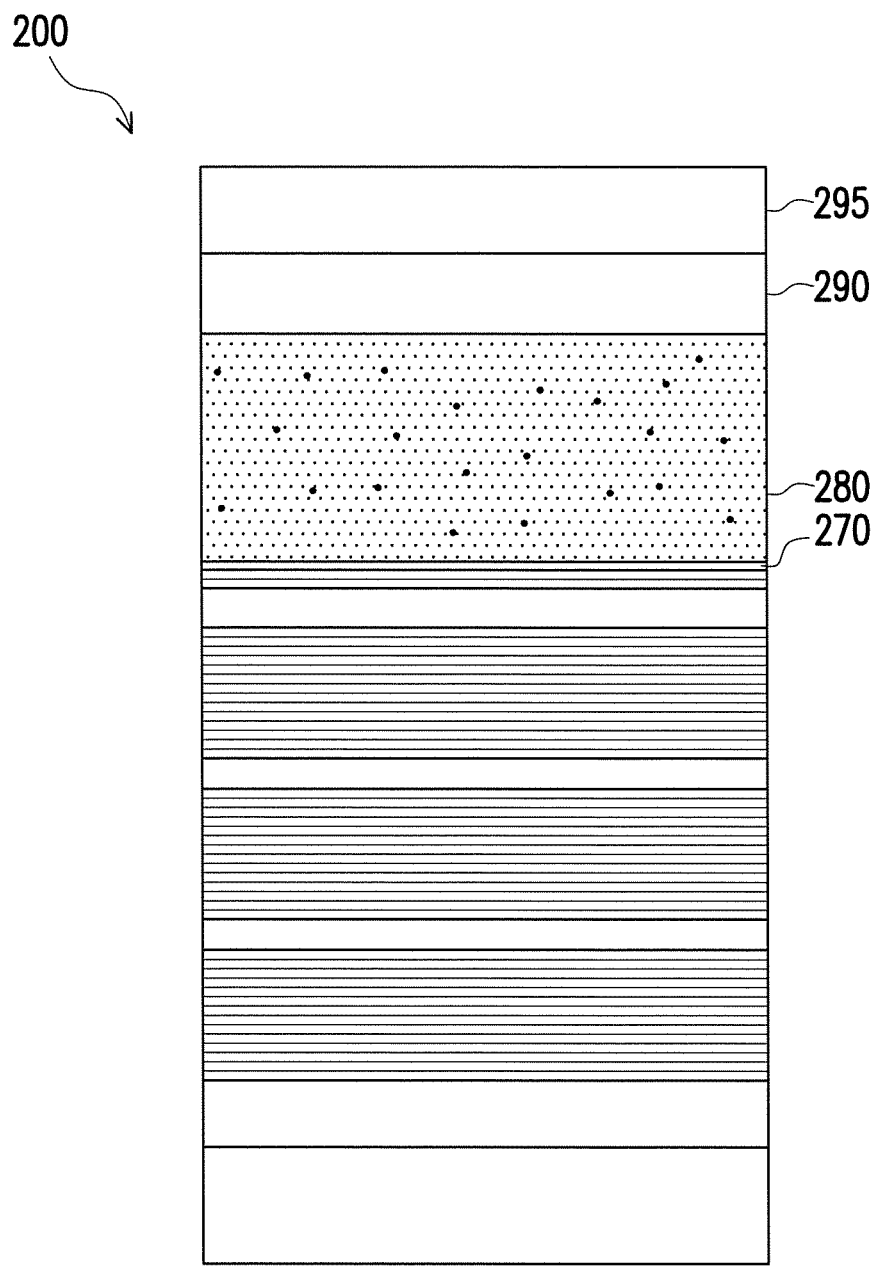
FIG. 11 is a cross-sectional view schematically illustrating a semiconductor structure according to another embodiment of the disclosure.

FIG. 11 is a cross-sectional view schematically illustrating a semiconductor structure according to another embodiment of the disclosure. Referring to FIG. 11, a main difference between FIG. 1 and FIG. 11 is that, in FIG. 11, the semiconductor structure 200 further includes an active layer 290 and a second doped semiconductor layer 295. The active layer 290 is disposed on the first doped semiconductor layer 280, and the second doped semiconductor layer 295 is disposed on the active layer 290. In this embodiment, the first doped semiconductor layer 280 is an n-type semiconductor layer, while the second doped semiconductor layer 295 is a p-type semiconductor layer. The first doped semiconductor layer 280 functions as an electron-provided layer and is in contact with the active layer 290. Besides, in this embodiment, the active layer 290 comprises multiple quantum wells, for example.

Figure 12:
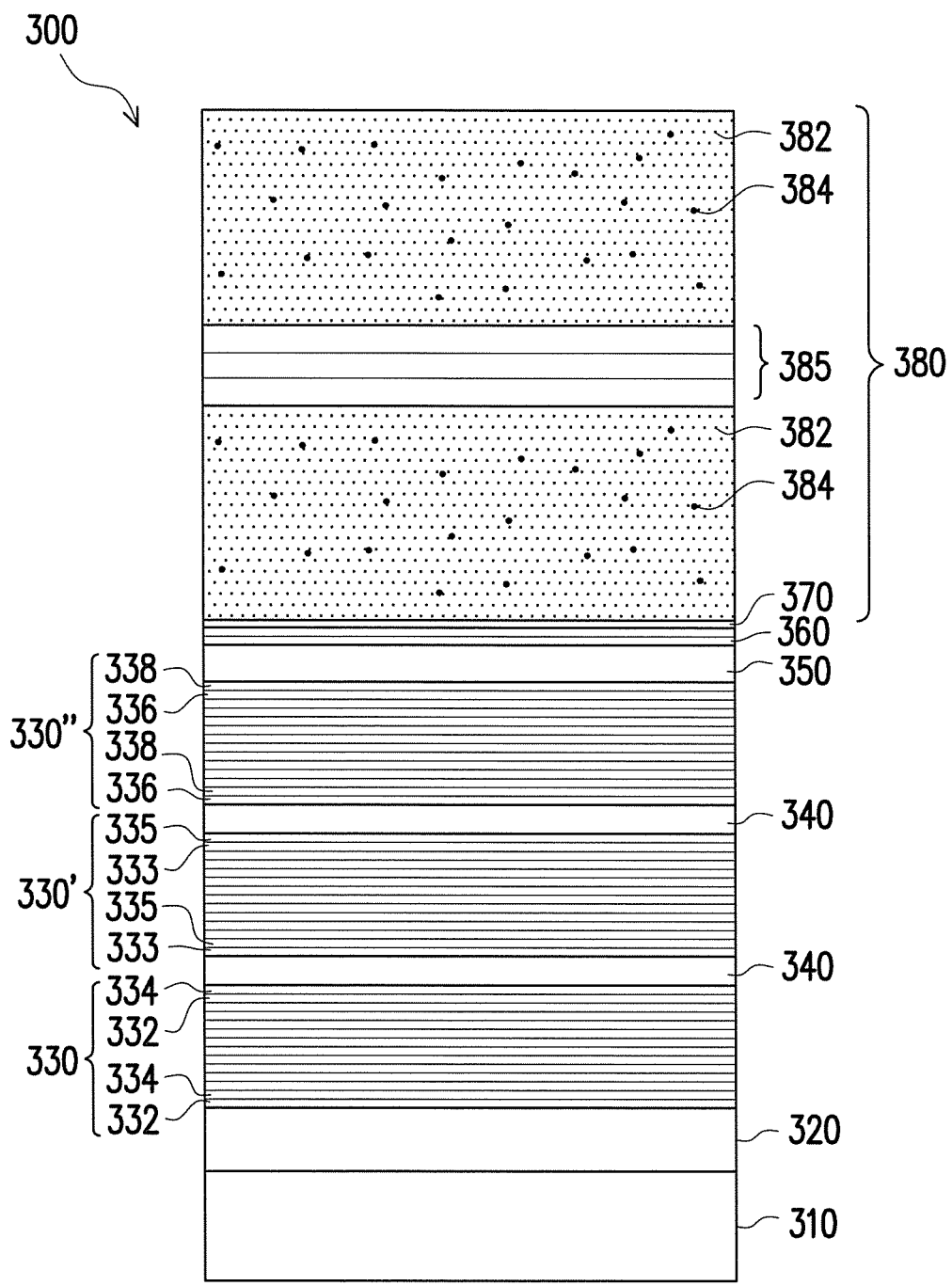
FIG. 12 is a cross-sectional view schematically illustrating a semiconductor structure according to another embodiment of the disclosure.

FIG. 12 is a cross-sectional view schematically illustrating a semiconductor structure according to another embodiment of the disclosure. Referring to FIG. 12, a semiconductor structure 300 of FIG. 12 includes a silicon substrate 310, a nucleation layer 320, a plurality of multi-layer sets 330, 330' and 330", at least one first interlayer 340, a mask layer 350, a second interlayer 360 and an undoped semiconductor layer 370, a plurality of first doped semiconductor layers 380 and at least one third interlayer 385. The nucleation layer 320 is disposed on the silicon substrate 310. The multi-layer sets 330, 330' and 330" are disposed on the nucleation layer 320, the multi-layer set 330 includes a plurality of first sub-layers 332 and a plurality of second sub-layers 334 stacked alternately, the multi-layer set 330' includes a plurality of first sub-layers 333 and a plurality of second sub-layers 335 stacked alternately, and the multi-layer set 330" includes a plurality of first sub-layers 336 and a plurality of second sub-layers 338 stacked alternately. An average aluminum content of the multi-layer sets 330, 330' and 330" decreases as a minimum distance between each of the multi-layer sets 330, 330' and 330" and the silicon substrate 310 increases, and an aluminum content of the first sub-layers 332, 333 and 336 is different from that of the second sub-layers 334, 335 and 338. Each first interlayer 340 is disposed between two of the multi-layer sets 330, 330' and 330" adjacent to each other. The mask layer 350 is disposed on the multi-layer sets 330, 330' and 330". The second interlayer 360 is disposed on the mask layer 350. The undoped semiconductor layer 370 is disposed on the second interlayer 360. The first doped semiconductor layers 380 are stacked over the undoped semiconductor layer 370, and the third interlayer 385 is disposed between two of the first doped semiconductor layers 380 adjacent to each other to slow down the stress between the two first doped semiconductor layers 380 so as to lower the crack probability of semiconductor structure 300. In the embodiment, the third interlayer 385 comprises a low temperature AlGaN layer, an AlN layer and an AlGaN layer, but the third interlayer 385 is not limited thereto. A total thickness of the first doped semiconductor layers 380 is about 2 µm to about 5 µm.

Figure 13:
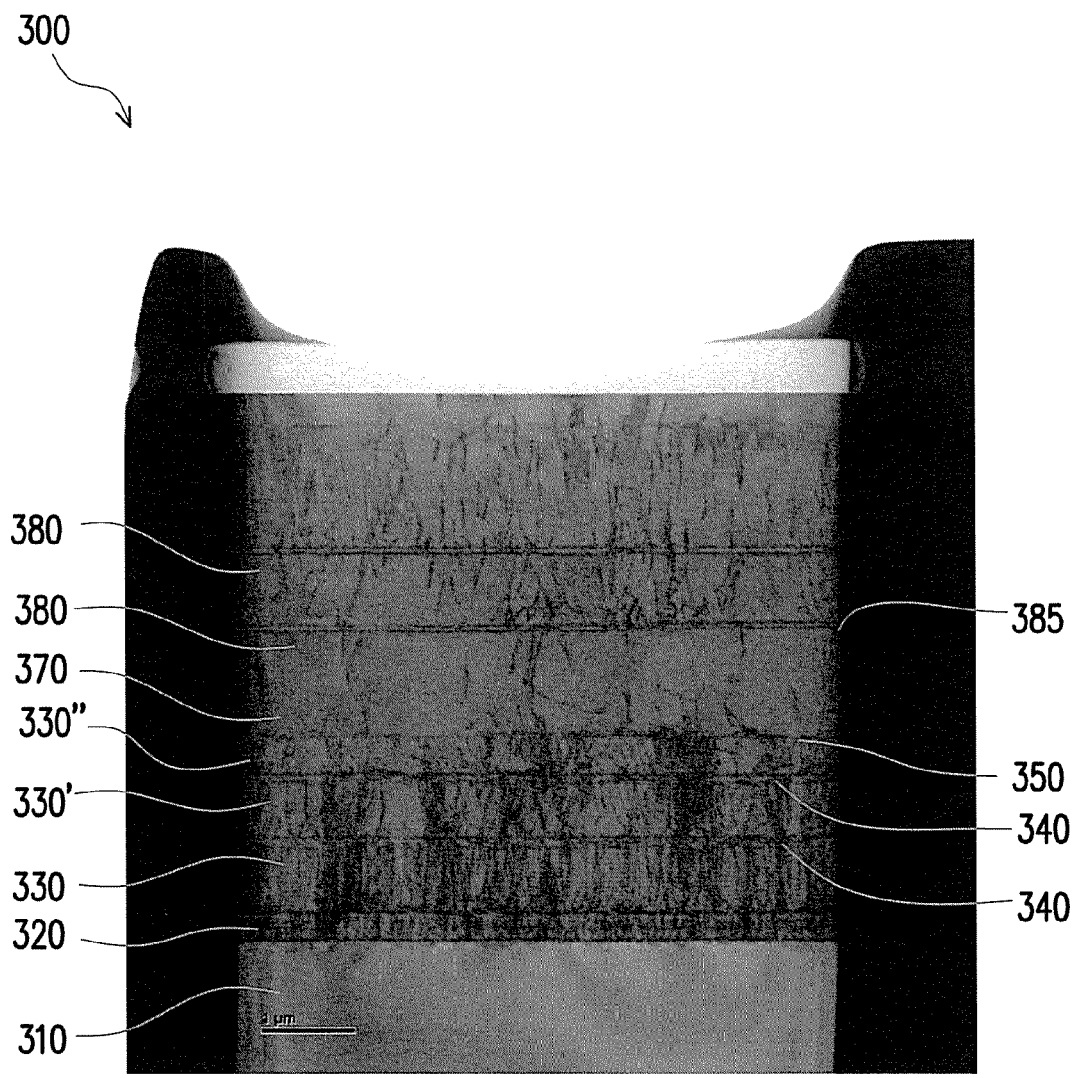
FIG. 13 is a transmission electron microscopic (TEM) picture of the semiconductor structure.

FIG. 13 is a transmission electron microscopic (TEM) picture of the semiconductor structure of. As shown in FIG. 13, the amount of defect from the multi-layer sets 330 close to the silicon substrate 310 to the multi-layer sets 330" away from the silicon substrate 310 is decreased substantially, and the defects are blocked by the mask layer 350 efficiently. Therefore, few defects are generated in the first doped semiconductor layers 380 such that the light emitting efficiency of the active layer formed thereafter can be further increased.

Figure 14:
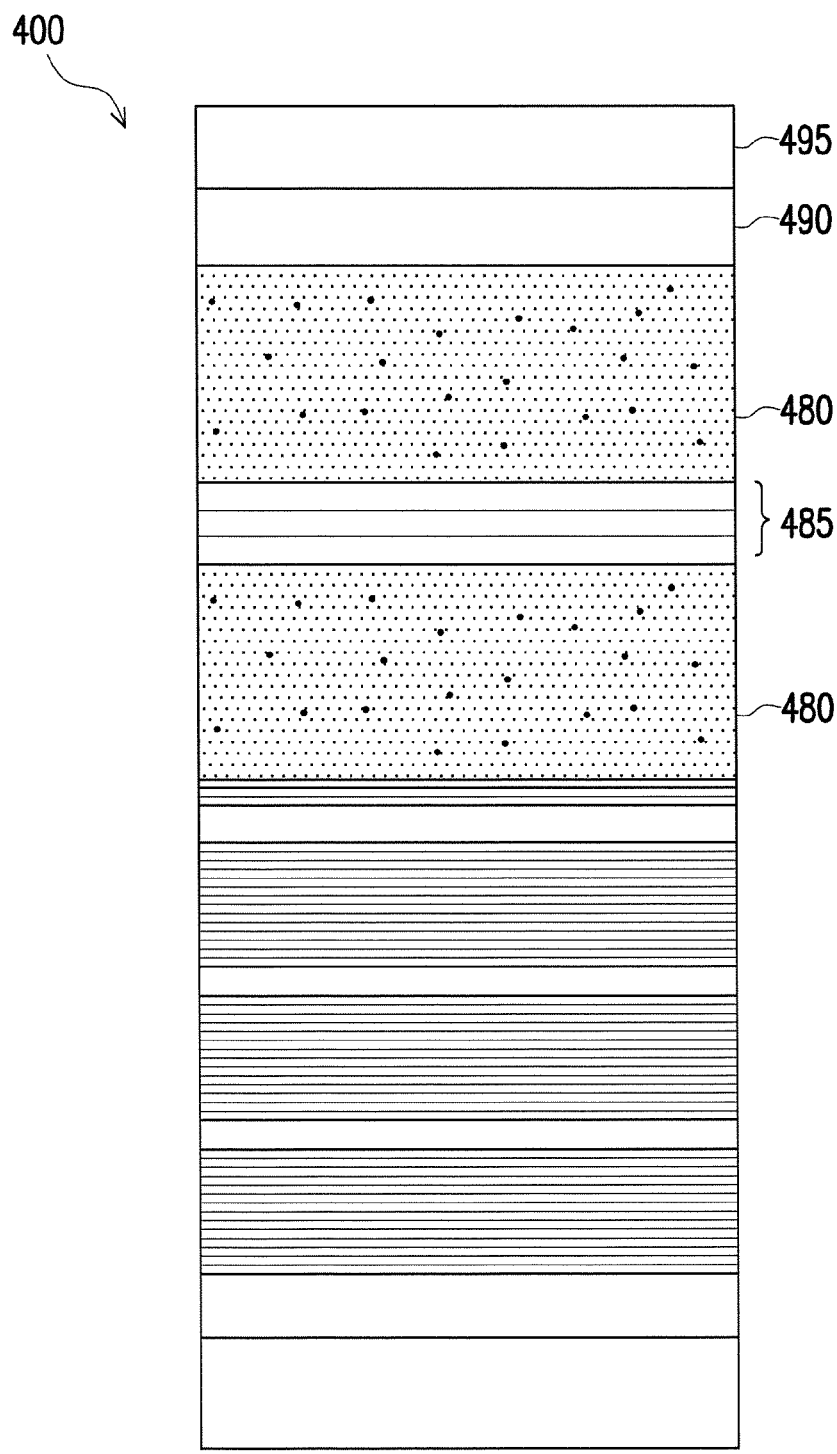
FIG. 14 is a cross-sectional view schematically illustrating a semiconductor structure according to another embodiment of the disclosure.

FIG. 14 is a cross-sectional view schematically illustrating a semiconductor structure according to another embodiment of the disclosure. Referring to FIG. 14, a main difference between FIG. 13 and FIG. 14 is that, a semiconductor structure 400 of FIG. 14 further includes an active layer 490 and a second doped semiconductor layer 495. The active layer 490 disposed on the first doped semiconductor layers 480, and the second doped semiconductor layer 495 disposed on the active layer 490. The active layer 490 and the second doped semiconductor layer 495 are similar to the active layer 290 and the second doped semiconductor layer 295 of the semiconductor structure 200 in FIG. 11.

According to the aforementioned embodiments, the mismatches of the lattices and the thermal expansion coefficient (CTE) between the first doped semiconductor layer and the silicon substrate can be improved by providing the multi-layer sets having the first sub-layers and the second sub-layers stacked alternately and the first doped semiconductor layer including the first dopant and the second dopant distributed within. Therefore, the crack possibility of the semiconductor structure can be minimized and the thickness of the semiconductor structure can be increased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor structure, comprising:
a silicon substrate;
a nucleation layer disposed on the silicon substrate; and
a plurality of multi-layer sets stacked over the nucleation layer, each of the multi-layer sets comprising a plurality of first sub-layers and a plurality of second sub-layers stacked alternately, a material of the first sub-layers and the second sub-layers comprising Al-containing III-V group compound, wherein an average aluminum content of the multi-layer sets decreases as a minimum distance between each of the multi-layer sets and the silicon substrate increases, and an aluminum content of the first sub-layers is different from an aluminum content of the second sub-layers.

2. The semiconductor structure as recited in claim 1, wherein a thickness of each of the multi-layer sets is about 0.6 µm to about 1 µm.

3. The semiconductor structure as recited in claim 1, further comprising at least one first interlayer disposed between two of the multi-layer sets adjacent to each other.

4. The semiconductor structure as recited in claim 1, further comprising a mask layer disposed on the multi-layer sets.

5. The semiconductor structure as recited in claim 4, further comprising a first doped semiconductor layer disposed on the mask layer.

6. The semiconductor structure as recited in claim 5, further comprising a second interlayer disposed between the mask layer and the first doped semiconductor layer.

7. The semiconductor structure as recited in claim 6, further comprising an undoped semiconductor layer disposed between the first doped semiconductor layer and the second interlayer.

8. The semiconductor structure as recited in claim 5, wherein a thickness of the first doped semiconductor layer is about 0.5 µm to about 1.5 µm.

9. The semiconductor structure as recited in claim 5, further comprising:
an active layer disposed on the first doped semiconductor stacked layer; and
a second doped semiconductor layer disposed on the active layer.

10. The semiconductor structure as recited in claim 5, wherein the first doped semiconductor layer comprises a first dopant and a second dopant, an atom radius of the first dopant is smaller than that of the second dopant, and a ratio of a content of the second dopant to a content of the first dopant in the first doped semiconductor layer is about 1:10 to about 1:1000.

11. The semiconductor structure as recited in claim 10, wherein the first dopant is silicon, and the second dopant is magnesium or Indium.

12. The semiconductor structure as recited in claim 10, wherein the contents of the first dopant and the second dopant vary periodically along a thickness direction of the first doped semiconductor layer.

13. The semiconductor structure as recited in claim 4, further comprising:
 a plurality of first doped semiconductor layers stacked over the mask layer; and
 a third interlayer disposed between two of the first doped semiconductor layers adjacent to each other.

14. The semiconductor structure as recited in claim 13, further comprising an undoped semiconductor layer disposed between the first doped semiconductor layers and the mask layer.

15. The semiconductor structure as recited in claim 13, further comprising:
 an active layer disposed on the first doped semiconductor layers; and
 a second doped semiconductor layer disposed on the active layer.

16. The semiconductor structure as recited in claim 13, wherein each of the first doped semiconductor layers comprises a first dopant and a second dopant, an atom radius of the first dopant is smaller than that of the second dopant, and a ratio of a content of the second dopant to a content of the first dopant in the first doped semiconductor layer is about 1:10 to about 1:1000.

17. The semiconductor structure as recited in claim 16, wherein the first dopant is silicon, and the second dopant is magnesium or Indium.

18. The semiconductor structure as recited in claim 10, wherein the contents of the first dopant and the second dopant vary periodically along a thickness direction of each of the first doped semiconductor layers.

19. The semiconductor structure as recited in claim 13, wherein a thickness of each of the first doped semiconductor layers is about 0.5 μm to about 1.5 μm.

20. The semiconductor structure as recited in claim 1, wherein a thickness of the nucleation layer is about 0.1 μm to about 0.3 μm.

* * * * *